United States Patent [19]

Sutherland

[11] Patent Number: 4,679,213
[45] Date of Patent: Jul. 7, 1987

[54] ASYNCHRONOUS QUEUE SYSTEM

[76] Inventor: Ivan E. Sutherland, 1035 Devon Rd., Pittsburgh, Pa. 15213

[21] Appl. No.: 689,635

[22] Filed: Jan. 8, 1985

[51] Int. Cl.$^4$ ...................... H03K 23/58; G11C 19/00
[52] U.S. Cl. ........................................ 377/66; 377/77; 377/81; 377/69
[58] Field of Search ............... 377/66, 77, 79, 81, 377/69

[56] References Cited

U.S. PATENT DOCUMENTS

| | | | |
|---|---|---|---|
| 3,212,009 | 10/1965 | Parker | 377/70 |
| 3,300,724 | 1/1967 | Cutaia | 377/67 |
| 3,510,680 | 5/1970 | Cogar | 377/66 |
| 3,727,204 | 4/1973 | de Koe | 377/66 |
| 3,736,575 | 5/1973 | Mallerich | 377/66 |
| 3,757,231 | 9/1973 | Faustini | 377/66 |
| 3,838,345 | 9/1974 | Schneider | 377/66 |
| 3,893,086 | 7/1975 | Nanya | 377/66 |
| 4,058,773 | 11/1977 | Clark et al. | 377/66 |
| 4,156,288 | 5/1979 | Spandorfer | 377/70 |

OTHER PUBLICATIONS

Seitz, "Introduction to VLSI Systems", Addison Wesley Publishers, Mead & Conway, Chapter 7, Illustration 7.24.

Primary Examiner—John S. Heyman
Attorney, Agent, or Firm—Nilsson, Robbins, Dalgarn, Berliner, Carson & Wurst

[57] ABSTRACT

A queue form of asynchronous register is disclosed with signal paths commonly carrying elements of both data and control. Binaries are intercoupled in two sequences and are individually cross coupled to register "one" bits in one sequence and "zero" bits in the other. Bits are manifest by signal level changes. Individual binaries are driven by logic to accomplish an operational rule based on the states of neighboring binaries in both sequences. Each binary in each sequences is controlled by the states of the predecessor and successor in its sequence and the predecessor and successor of its associated binary in the other sequence. Specifically, if predecessor and successor binaries in a sequence are in different states, and predecessor and successor binaries of an associated binary in the other sequence are in the same state, the state of the predecessor is to be taken.

14 Claims, 5 Drawing Figures

ASYNCHRONOUS QUEUE SYSTEM

This is a continuation in part of co-pending application Ser. No. 688,848 filed Jan. 4, 1985, and directed to an invention by Ivan E. Sutherland entitled "Asynchronous FIFO System".

BACKGROUND AND SUMMARY OF THE INVENTION

This invention relates generally to asynchronous register systems as used in the computing field. More specifically, it relates to asynchronous register systems in which data signals are transfered bi-directionally without regard to clock signals or other timing devices, rather, the speed of operation for an asynchronous system is determined essentially by the speed of the circuitry within the system. Consequently, the asynchronous nature of the system of the present invention allows its embodiments to operate at the maximum speed of the circuitry in such embodiments.

Recognizing the numerous advantages of asynchronous or self-timed data processing systems, the parent case hereto discloses a new form of data control for asynchronous operation utilizing retrograde data paths. The data structure is disclosed in the parent case as used in a so-called FIFO system or register. The present invention is based on the recognition of the capability of such data structures to be used in sequences or strings with reciprocal control so as to effect control and registration. While the parent case disclosed a first-in-first-out register (FIFO) the disclosed embodiment of the present invention is a so-called "queue" register.

FIFO systems (first-in, first-out registers) are used in computers to provide time independence between the processing operations preceding and following the FIFO. Essentially, a FIFO is used to decouple a processor before it from the one following it. Accordingly, a FIFO can deliver data to a later processor even if the earlier process has temporarily halted. Similarly, a FIFO can hold data from a preceding processor while a later unit is temporarily unable to accept data. The independence of these systems from timing clocks enables such operations.

Clocking operations in computers inherently raise numerous problems; however, most prior computing systems were built with clocked logic. Each step in the computing process proceeds according to the beat of the clock; identical clock signals are delivered to all parts of the system, just as identical drum beats are delivered to all men in a marching column. On the contrary in the system hereof, elements of data move forward without clocking delays, however, with due regard to avoiding destruction of other data in the sequence. As recognized in the parent case, the control of a string of individual cells (for elements of data) with retrograde flow may be implemented to consider the state of a predecessor cell and that of a successor cells, remaining ignorant of other global conditions. The present invention involves an embellishment of that concept.

In general, two types of local control can be employed in sequential systems to preserve orderly movement of data. According to one type of control, the same wires that carry data signals from one cell to the next cell also carry control information. Such mechanisms are usually designed for systems that carry data elements of only a single bit. Such a one-bit sequential system (with data and control carried on the same wires) is called a "queue". Queues can be designed to carry multiple bit data elements, but additional logic is required for such systems.

Recapitulating to some extent, consider further the substance of the present invention as related to the parent case. The asynchronous FIFO and asynchronous queue are somewhat similar structures in that both can provide temporary storage for data moving between systems that operate at offset speeds. The registers are different in one main aspect: in addition to data paths, the FIFO incorporates extra (separate but parallel) control paths to carry control signals representative of the presence or absence of data on the data paths. In distinction, the queue, as described herein, uses the same signalling paths for both data and control.

Considering another generality, FIFOs traditionally are used where data elements are composed of a multiplicity of individual binary bits. Such data elements are generally called "words" and the number of bits in each such element is called the "width" of the word. A queue is generally most useful when the data elements consist of a single bit, or at most a few bits, that is, when the words are one bit wide or at least quite narrow As indicated above, it is generally characteristic of a queue that the same signal paths are used for both data and control. In that regard, it has been previously recognized that signal paths in a queue must be capable of transmitting more than two states. For example, in U.S. Pat. No. 3,166,715 (Cogar), a system is described in which two wires transmit binary codes to manifest spaces between bits. A subsequent patent by the same inventor (U.S. Pat. No. 3,510,680) discloses the use of pulses rather than level codes. In that regard, most previous queues have related data values to signal levels. For example, one signal level may represent a logical zero, another level represents a logical one. Such systems relating data values to signal levels might involve the action of electrical current, fluid signals or any of a variety of other binary criteria.

In accordance with the present invention, contrasting to traditional binary queues, information is represented in terms of changes in signal level. That is, each change in one signal represents a logical "one". Similarly, each change in another signal represents a logical "zero". In accordance herewith, sequencing in the two paths is controlled by reciprocal couplings in the structure.

As information is carried by transitions between signal levels in the system of the present invention, each such transition representing data, the system is able to transmit one bit of information per signal level transition. Conversely, previously known systems utilizing signal levels to represent information, have required two transitions per bit transmitted. In that regard, the present invention is distinct from prior systems. Furthermore, the system of the present invention provides for retrograde transmission of data values.

The operation of an asynchronous transition queue as described herein can be explained preliminarily in terms of a group of men and women, each performing tasks in accordance with a precise and specific instruction. Of course, as disclosed in detail below, the system would be practically implemented utilizing any of a variety of electrical, mechanical, optical, pneumatic, biological or other logic structures.

Pursuing the exemplary human queue, suppose that two lines are formed, one consisting of women, the other consisting of men. In the example, men register "zero" bits, while women register "one" bits. Such registrations are accomplished by the action of raising or lowering the hands. For example, a male transition is accomplished when a man moves his hand indicating a change in the "zero" channel. Similarly, a change is indicated in the "ones" channel by a female transition when a woman moves her hands.

Each man associates with a particular woman to function as a singular data cell. Accordingly, each couple can transmit a binary "one" by a female transition, and a binary "zero" by a male transition.

In the alignment, each couple will have a predecessor couple and a successor couple. Thus, each individual has a partner of the opposite sex and a predecessor and a successor of the same sex. In such a configuration, the assumed group can act as a queue by each following a simple rule of behavior. Essentially, the behavior rule commands that each person will copy the position of his predecessor person (to pass information forward) but will avoid overtaking previously passed information. The rule of behavior is a modification of a behavior rule set forth in the parent case. Specifically, in accordance herewith, the rule may be stated for each person (except the first and last) as follows: if your predecessor and successor are in opposite states, and the states of your partner's predecessor and successor match, then copy the state of your predecessor, otherwise remain as you stand.

Suppose that all the people begin with their hands down. If the first man is instructed to raise his hands (representing a binary "zero"), the second man (acting on the rule) would be obliged to raise his hands, thus obliging the third man to raise his hands, and so on throughout the line until all the men have raised their hands. Assume for the moment that as the output element, the final man in the line may not lower his hands until such lowering is approved by an instruction from the output.

Now suppose that another transition is introduced into the men's row, representing a second binary "zero". The second "zero" is represented by the first man lowering his hands. The wave of hand lowering will proceed to and include the next to the last man. Recall that for the moment the last man remains with his hands up until an external signal allows a change.

With the introduction of a third binary "zero", another wave of hand moving occurs, in this instance, another raising of the hands. Thus, as the process of entering binary "zeros" proceeds, each new wave (representing an additional binary "zero") moves through the male portion of the human queue stopping at the end of the queue where data is registered. Consequently, the males at the end of the register stand configured alternately with hands raised and hands lowered.

Now, in addition to the "zeros" registered by the males, consider an action by the women to register "ones". Upon the introduction of a "one", the first woman raises her hands. Immediately, the second woman is obliged to follow her instruction raising her hands to join the first. Accordingly, a "ones" wave propagates through the line of women down the queue. However, when the wave reaches the man configured to register a "one", it encounters a situation of the woman's partner's (man's) predecessor and successor, being in opposite states. Consequently, the rule of behavior obligates the woman at that stage to do nothing. And so the situation develops with "zeros" registered by men at the end of the line and "ones" registered by women behind them. Thus, an orderly registration configuration is accomplished.

The human analogy illustrates the relatively simple instruction for individual data units in the sequences, one of which accommodate "zeros", while the other accommodates ones. Their functionally interrelated instructions based upon predecessor and successor states, affords the somewhat basic operation of the system of the present invention, as set forth in detail with respect to the disclosed embodiment.

BRIEF DESCRIPTION OF THE DRAWINGS

In the drawings, which constitute a part of this specification, exemplary embodiments exhibiting various objectives and features hereof, are set forth, specifically.

DETAILED DESCRIPTION OF THE INVENTION

Figure 1:
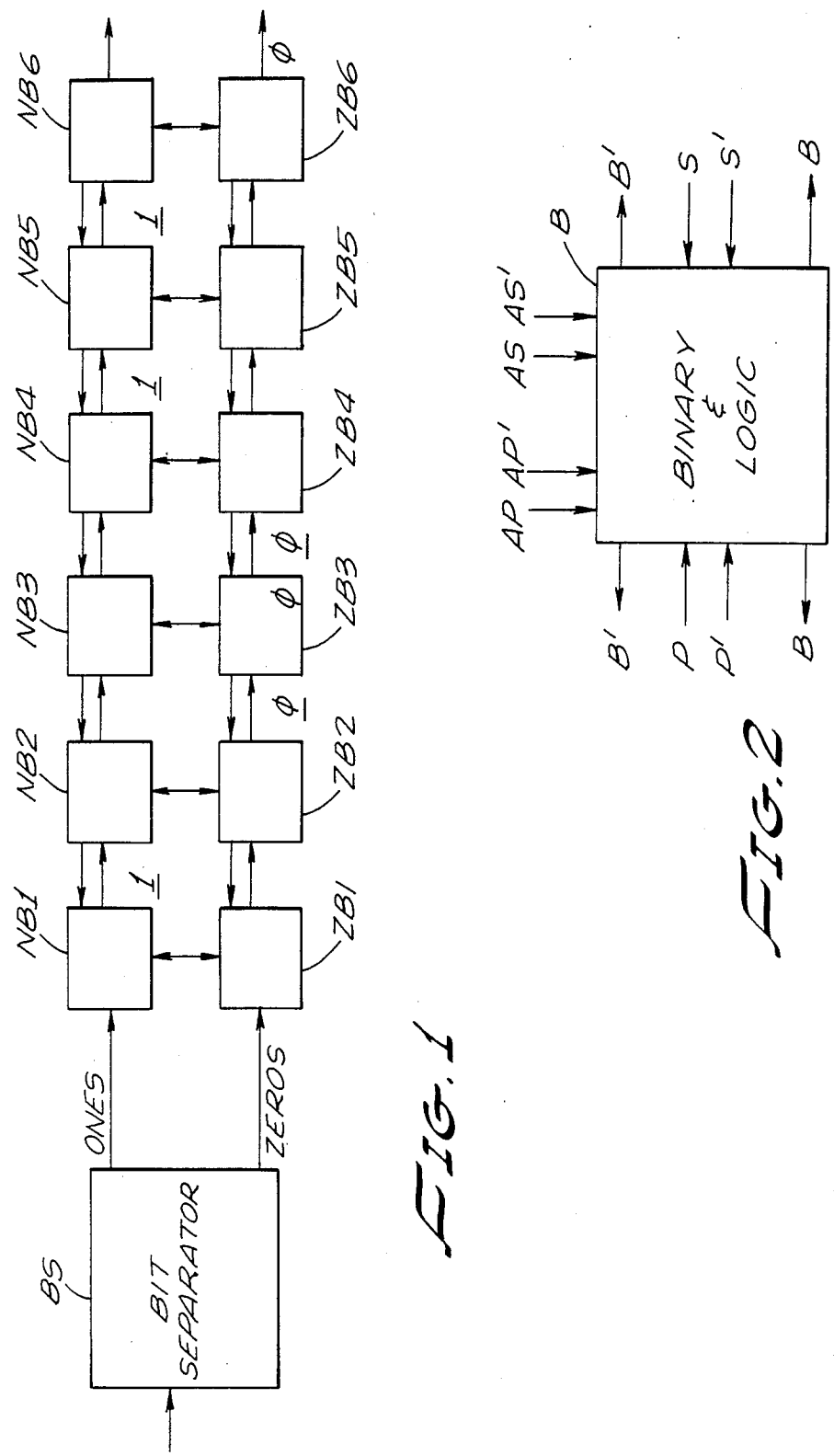
FIG. 1 is a simplified block diagram for illustrating the system of the present invention.

FIG. 1 illustrates an asynchronous register in accordance with the present invention. A bit separator BS receives a stream of binary bits and separates the stream as either "ones" or "zeros". One bits are supplied to an upper sequence of binary units NB1–NB6. Zero bits are supplied to a lower sequence of binary units ZB1–ZB6. In accordance with the present invention, the stream of binary bits are received to move asynchronously through the sequences of binary units while maintaining an orderly arrangement.

Each pair of associated binary units, e.g. units NB1 and ZB1 is capable of being in one of two binary states. If, for example, the unit NB1 is active to register a "one" as illustrated, the unit ZB1 is void, simply holding the space for the "one" registration. Similarly, if for example, the unit ZB2 registered a "zero" as illustrated, the unit NB2 is void as a space holder. Thus, the units either control or register.

As indicated, the operation of the register or queue is asynchronous. Accordingly, bits move through the units NB and ZB as rapidly as the circuits will accommodate.

In normal operation, the queue will not be full. Rather, digits will enter and leave independently with regard to time, providing storage as between a pair of data processors. When the queue is partly loaded and quiescent for a brief time, the digits will stack up at the output end. Accordingly, the queue is analogous to a line of waiting people, also sometimes called a "queue".

In the operation of the system of FIG. 1, digits stack up and wait in the units at the output end until the digits are called out of storage. The space behind the stack of digits is promptly closed by new arrivals as explained in detail below. Such motions are accomplished by reciprocal control and without the use of clock signals. The implementation is accomplished by a simple rule of operation for each of the binary units NB and ZB as indicated above. Specifically, the rule is: if your predecessor and successor are in different states and your partner's (associated unit) predecessor and successor are in the same state, then copy your predecessor's state.

Figure 2:
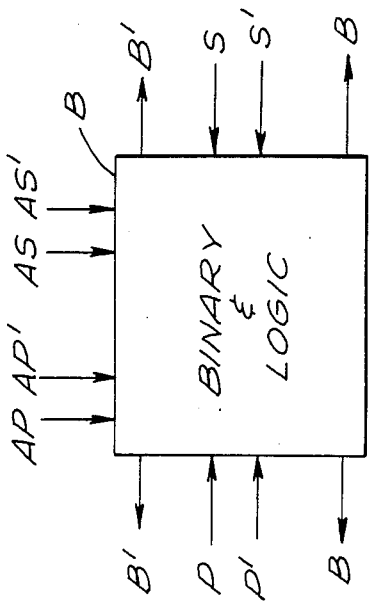
FIG. 2 is a logic block representation as may be used in the system of the present invention.

The individual binary units NB and ZB may take a wide variety of different structural forms. FIG. 2 illustrates an exemplary form. A unit B includes a flop flop or other form of binary device along with certain logic to implement the control and storage functions described above. The flip flop has two states manifest as B and B'. The states of a predecessor unit in a sequence of the binaries are represented as P and P'. Somewhat similarly, the states of a successor unit in a sequence of the binaries are represented as S and S'. The states of the predecessor and successor units for an associated unit are also significant.

Consider the associated units NB2 and ZB2. The predecessor and successor units to unit NB2 are respectively NB1 and NB3. The predecessor and successor units of the associated unit of NB2 are respectively ZB1 and ZB3. For the representation of FIG. 2, the states of an associated unit's predecessor are designated AP and AP' while those of the successor are designated SP and SP'.

Using the representations indicated above, the structure of FIG. 2 may comprise simply a binary that is controlled by logic to accomplish:

COPY P AS B IF: [(P'·S)+(P·S')]·[(AP'·AS')+(AP·AS)]

Figure 3:
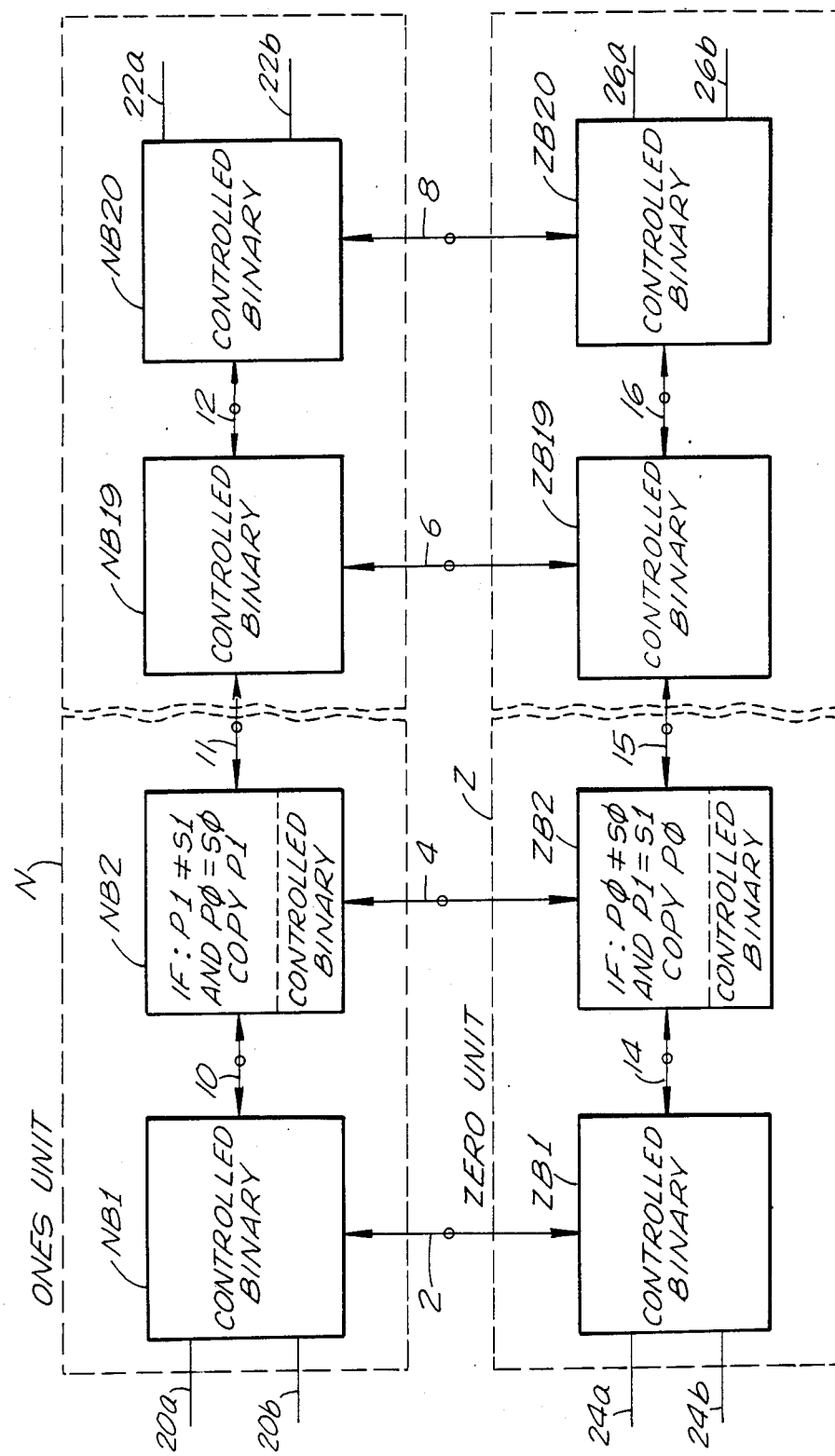
FIG. 3 is a block diagram of a queue constructed in accordance with the present invention.

The assembly of individual binary units in sequences with such logic accomplishes the operation as described above. Considering a system in greater detail, FIG. 3 illustrates a queue of the present invention. A "ones" unit N (top) is operatively coupled to a "zeros" unit Z (bottom) each showing elements to represent twenty in each unit. Specifically, the "ones" unit N illustrates controlled binaries NB1, NB2, NB19, and NB20. The "zeros" unit Z illustrates controlled binaries ZB1, ZB2, ZB19, and ZB20. The controlled binaries in each of the units N and Z are similar and operate coupled together in their sequence with reciprocal consideration as described in detail below.

Essentially, data bits move through the units N and Z under reciprocal control. Specifically, "one" bits move through the "ones" unit N and "zero" bits move through the "zeros" unit Z. However, movement occurs under reciprocal control between the units. As a consequence, spaces are maintained in each unit at locations where data is registered in the other unit. Accordingly, a controlled binary will not change its state to propagate a bit if its associated binary is registering a bit.

Note that a pair of binaries may be associated with either a "one" bit or a "zero" bit, not both. That is, an intercoupled pair of binaries NB and ZB register a "one" bit or a "zero" bit.

Relating the system of FIG. 3 to the human analog described above, the controlled binaries NB of the "ones" unit N perform the female role, while the controlled binaries ZB of the "zeros" unit perform the male role. Again, note that the binaries do not register binary bits by their states, rather, binary bits are registered by state differences between a pair of horizontally adjacent binaries As indicated in FIG. 3, the controlled binaries NB of the "ones" unit N are directly coupled to the controlled binaries ZB of the "zeros" unit Z. Specifically, for example, the controlled binary NB1 is connected to the controlled binary ZB1 through a bidirectional line 2. Remaining binary pairs NB2 and ZB2, NB3 and ZB3, NB4 and ZB4 are interconnected by bidirectional lines 4, 6, and 8 respectively, each of which may comprise a cable as indicated.

In addition to the cross connections between the binaries (between units N and Z), the binaries are sequentially connected within each of the units N and Z. Specifically, the binary NB1 is connected to the binary NB2 by a line 10. In sequence, the line 12 similarly connects the binaries NB19 and NB20. In the same pattern, the lines 14 and 16 interconnect the binaries ZB1 to ZB2 and ZB19 to ZB20.

Individual input and output pairs serve each of the units N and Z. Specifically, input to the unit N is by lines 20a and 20b. Output is from lines 22a and 22b. In a similar relationship, the unit Z has input lines 24a and 24b along with output lines 26a and 26b. In the sequences, the controlled binaries in the units N and Z each follow the rule of operation as stated above and indicated in logic.

Figure 4:
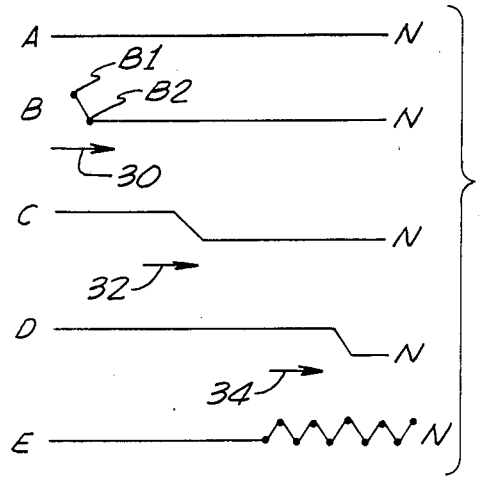
FIGS. 4 and 5 are state diagrams illustrative of a system of FIG. 3.

Referring now to FIG. 4, a series of state diagrams are represented indicative of specific states of the twenty binaries in the "ones" unit N of FIG. 3. The straight line of FIG. 2A indicates that all of the twenty binaries are in the same state, e.g. low. In the representative format, each segment of line indicates a binary in the order of the sequence. If the binary is in a low state, the representative line segment (or dot) is low. Otherwise, if the binary is high, the line segment also is high.

Pursuing the state indicated in FIG. 4A, also assume that the "zeros" unit Z of FIG. 3 is empty. For the present, activity will be limited to the "ones" unit N as indicated by the diagrams of FIG. 4.

Assume next that a "one" bit is manifest for the unit N in the form of a signal level change in the signal paths 20a and 20b. Promptly, the controlled binary NB1 perceives that its predecessor state (input) does not coincide to its successor state, i.e. P1≠S1. Also, as the "zeros" unit Z is empty, the signal in the line 2 indicates that the associated unit's predecessor and successor are in the same state, i.e. P0=S0. Consequently, the controlled binary NB1 assumes a high state (P1) as represented in FIG. 4B at dot B1.

Pursuing the operational rule, consider the action of the binary NB2. Specifically, signals manifest to the binary NB2 through the lines 10 and 11 indicate that the predecessor binary NB1 is not in the same state as the successor binary NB2. Furthermore, as the zeros unit is empty (all binaries in same state), the predecessor and successor of the associated binary ZB2 are in the same state. Consequently, the binary NB2 copies the state of the binary NB1 and the representative dot B2 (FIG. 4B) will go high. Note that the arrow 30 adjacent the dots B1 and B2 indicates a transitory or unstable condition. Thus, a wave propagates through the binaries NB as represented in FIGS. 4C and 4D. The arrows 32 and 34 again indicate a transitory state. In the final action, the last binary in the sequence, e.g. NB20, assumes the high state of the other binaries.

At this point it is to be noted that a special limitation is imposed on the last binaries NB20 and ZB20. Specifically, the binaries NB20 and ZB20 receive a signal R indicating that the receiving apparatus is ready to accept data. In the absence of receiving a signal R, the binaries NB20 and ZB20 are locked in their last state. Accordingly, in the described action, the binary NB20 simply remains high. This operation will be treated in further detail below in relation to the passage of data from the queue.

Assuming the arrival of several additional "ones", say to make a total of ten in sequence. The states of the binaries NB in the unit N will have a configuration as illustrated in FIG. 4E. Specifically, the alternate states of adjacent binaries are indicated by transitions between high and low positions with the consequence that a dotted sawtooth configuration represents the situation.

Note that the initial portion of the line in FIG. 4E is straight and in the low position indicating that the initial binaries are clear, ready to accept additional data. Thus, ten bits have been received and nine are registered. Accordingly, a simple stacked configuration has been developed for the sequence of received "one" bits.

Figure 5:
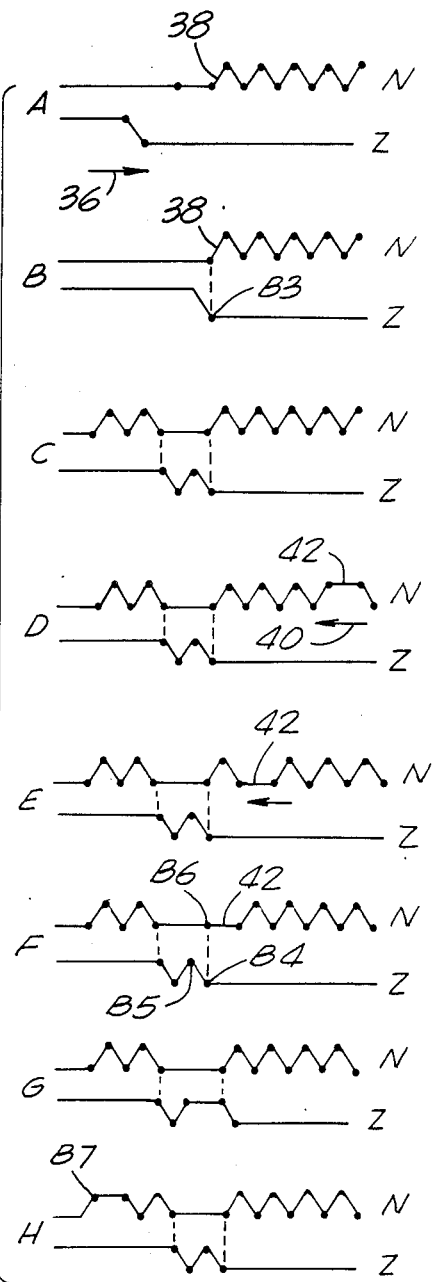

Consider now a sequence following that described above in which the "zero" bits are received to be stored in the "zeros" unit Z. The situation will be described with reference to the state diagrams of FIG. 5 in which the lines N represent the binaries of unit N while lines Z represent the binaries of unit Z. Pursuing the assumed conditions, the "ones" unit N registers nine bits manifest by the fact that the last ten binaries in the unit N are alternately in opposite binary states. The condition is illustrated by the upper line N of FIG. 5A. With the introduction of a "zero" into the "zeros" unit Z (FIG. 3) the controlled binary ZB1 will change state. As explained above with respect to the unit N, the rule of operation for the individual binaries cause the change of state to propagate through the binaries. Specifically, as illustrated by the lower line Z in FIG. 5A, an edge will propagate through the binaries ZB as a wave. An arrow 36 indicates the unstable state.

When the wave reaches the location of the last "one" (edge 38) registered in the "ones" unit N, it will encounter a binary with an associated "ones" binary whose predecessor and successor are in opposite states. Consequently, the encountered binary represented by a dot B3 holds its state to produce a configuration as illustrated in FIG. 5B. Thus, the association of reciprocal connection between the binaries in the "ones" unit N and those in the "zeros" unit Z for implementing the rule of logic, prevent data movements which would prompt confusion. Accordingly, each associated pair of binaries, e.g. binaries NB1 and ZB1 or NB2 and ZB2, are capable of registering a single binary bit. If the bit is a "one", it will be registered by the opposed states of adjacent binaries in the "ones" unit N. Conversely, if the bit is a "zero", it will be registered by opposed states for adjacent binaries in the unit Z.

As "ones" and "zeros" are applied to the queue as illustrated in FIG. 3, data bits will be stacked by a synchronous wave motion to accomplish the desired registration. For example, after the application of ten "one" digits, three "zero" bits, and then four additional "one" bits, the stable situation will appear as represented in FIG. 5C. Each of the bits mentioned is accounted for by a diagonal line between dots indicating binary states. Note that the diagonal lines are never coincident between the two line diagrams representing the states of the units N and Z. That is, a diagonal line section in one diagram consistently is associated with a straight line section in the associated diagram.

Consider now the operations attendant withdrawing data from the queue. Assume that a processor connected to the output of the queue of FIG. 3 is prepared to accept data and as a consequence changes the signal 22b provided to the last binary NB20. The state of the queue is indicated in FIG. 5C at a time when a request for data is signalled. Immediately, the last controlled binary N20 changes state. The change occurs because the predecessor and successor are in opposite states and, accordingly, the predecessor state is copied. Immediately, the binary NB19 is obliged to change states because its predecessor and successor are in opposite states and it is obliged to copy its predecessor. Note, the neighbor binaries in unit Z are uniform. Immediately after the binary NB20 changes states, the situation will be as illustrated in FIG. 5D. An arrow 40 indicates a transitory condition.

In the action that follows, a flat section 42 of the line N (FIG. 5D) moves left. Specifically, the third-to-last binary NB18 must act, again because its predecessor and successor are in different states. The action will continue, the section 42 progressing to the left as represented in FIG. 5E, until a binary ZB in the "zeros" unit Z becomes involved. FIG. 3F illustrates that state. Specifically, the line segment 42 has reached an active binary in the "zeros" unit Z. The state indicated for a binary by a dot B4 is different from the predecessor state indicated by a dot B5. Furthermore, considering the "ones" unit N binary represented by a dot B6, the predecessor and successor binaries are in the same state. Accordingly, the binary represented by the dot B4 changes state to depict the situation as illustrated in FIG. 5G. Accordingly, a wave of activity propagates backward through the "zeros" unit Z until the situation develops as depicted in FIG. 5H. In that situation, the binary represented by the dot B7 is about to act with the consequence that the queue will attain a temporarily quiescent state.

From the above description it is apparent that the queue of the present invention involves cooperative units each including sequences of binaries controlled and interconnected in such a manner as to effectively register data. The essence of the system involves the states rule of operation involving predecessor and successor states in both units which functions to control retrograde data movement.

As indicated above, the system hereof may be variously implemented utilizing a wide variety of different structures and elements. Of course, it will be appreciated that systems embodying the principles hereof may be embodied in a host of different structural formats. Accordingly, it is deemed appropriate that the scope hereof be in accord with the claims as set out below.

What is claimed is:

1. A register for binary digital data comprising:
    a first series of binaries for registering one binary digit;
    a second series of binaries individually associated with binaries of said first series and for registering another binary digit;
    control means intercoupling said first and second series of binaries for causing a binary to assume the state of its predecessor when its predecessor and successor are in different states and the predecessor and successor of its associated binary are in the same state.

2. A register according to claim 1 wherein said control means intercoupling said binaries actuates said binaries to operate asynchronously.

3. A register according to claim 1 wherein said control means intercoupling said binaries comprises means for transferring data between said binaries by signal level changes.

4. A register according to claim 1 further including input means for supplying "ones" digits to said first series of binaries and "zeros" digits to said second series of binaries.

5. A queue register for binary bits comprising:
input means for supplying first binary bits to a first path and second binary bits to a second path;
a first plurality of binaries interconnected in a sequence and coupled to receive said first binary bits from said first path;
a second plurality of binaries interconnected in a sequence and coupled to receive said second binary bits from said second path; and
means intercoupling said pluralities of binaries in associated means relationship for inhibiting progression of binary bits in said sequences to preserve an orderly registration of binary bits in said first and second pluralities and to allow propagation of a state signal into a binary when the successor to said binary is in an opposed state to the state signal and the binaries contiguous to an associated binary are in similar states.

6. A register according to claim 5 wherein said input means supplies said bits represented as signal level changes.

7. A register according to claim 5 wherein said means intercoupling comprises an asynchronous structure.

8. A register according to claim 5 wherein said means for inhibiting allows propagation of a state signal into a binary only if the successor to said binary is in an opposed state to the state signal and the binaries contiguous to an associated binary are in similar states, wherein said input means supplies said bits represented as signal level changes, and furthermore wherein said means intercoupling comprises an asynchronous structure.

9. A register according to claim 1 wherein said control means intercouples said binaries to operate asynchronously and wherein said control means includes means for transferring data between said binaries by signal level changes.

10. A register according to claim 9 further including input means for supplying "ones" digits to said first series of binaries and "zeros" digits to said second series of binaries.

11. A queue register for binary bits comprising:
input means for supplying first binary bits to a first path and second binary bits to a second path said bits being represented as signal level changes;
a first plurality of binaries interconnected in a sequence and coupled to receive and respond to said first binary bits from said first path;
a second plurality of binaries interconnected in a sequence and coupled to receive and respond to said second binary bits from said second path;
means intercoupling said binaries between said first and second pluralities to provide pairs of binaries; and
means for selectively inhibiting progression of binary bits in said sequences of binaries to preserve an orderly registration of binary bits in said first and second pluralities, said means for inhibiting allowing progression of binary bits to a sequence binary under control of binaries contiguous to said sequence binary and binaries contiguous to the binary in pair relationship with said sequence binary.

12. A register according to claim 11 wherein said means intercoupling comprises an asynchronous structure.

13. A register according to claim 11 wherein said means for selectively inhibiting allows propagation of a state signal into a sequence binary when the successor to said sequence binary is in an opposed state to the state signal and the binaries contiguous to said binary in pair relationship are in similar states, wherein said input means supplies said bits represented as signal level changes, and furthermore wherein said means intercoupling comprises an asynchronous structure.

14. A register according to claim 11 further including input means for supplying "ones" digits to said first series of binaries and "zeros" digits to said second series of binaries.

* * * * *